(12) United States Patent
Yagi

(10) Patent No.: US 10,541,684 B2
(45) Date of Patent: Jan. 21, 2020

(54) INPUT/OUTPUT CIRCUIT

(71) Applicant: LAPIS SEMICONDUCTOR CO., LTD., Kanagawa (JP)

(72) Inventor: Katsuyoshi Yagi, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/202,012

(22) Filed: Nov. 27, 2018

(65) Prior Publication Data

US 2019/0165785 A1     May 30, 2019

(30) Foreign Application Priority Data

Nov. 28, 2017    (JP) .................................. 2017-227457

(51) Int. Cl.
    *H03K 19/003*     (2006.01)
    *H03K 17/687*     (2006.01)
    *H03K 19/00*     (2006.01)

(52) U.S. Cl.
    CPC ..... *H03K 19/00315* (2013.01); *H03K 17/687* (2013.01); *H03K 19/0013* (2013.01)

(58) Field of Classification Search
    CPC ......... H03K 19/00315; H03K 19/0013; H03K 17/687
    See application file for complete search history.

(56) References Cited

U.S. PATENT DOCUMENTS

2006/0197555 A1*   9/2006   Takemura .......... H03K 19/0013
                                                                   326/86

FOREIGN PATENT DOCUMENTS

JP     2005-260587 A     9/2005
JP     2006-157081 A     6/2006

* cited by examiner

*Primary Examiner* — Seokjin Kim
(74) *Attorney, Agent, or Firm* — Volentine, Whitt & Francos, PLLC

(57) ABSTRACT

An input/output circuit including: a first transistor that, based on an input signal and an enable signal input to an enable terminal that switches a validity and invalidity of an output, drives a load connected between an output terminal and an external power supply; a first switch provided between the input terminal and a control terminal of the first transistor, and including a first switching terminal that switches between connecting or blocking the input signal; and a switch control section that controls the first switching terminal based on the enable signal, wherein, when a logic of the enable signal has transitioned, the switch control section controls the first switching terminal to cause the first switch to be in a connecting state for a predetermined period, to input the input signal to the control terminal of the first transistor, and to suppress a current flowing to the load.

6 Claims, 2 Drawing Sheets

INPUT/OUTPUT CIRCUIT

CROSS-REFERENCE TO RELATED APPLICATION

This application is based on and claims priority under 35 USC 119 from Japanese Patent Application No. 2017-227457, filed on Nov. 28, 2017, the disclosure of which is incorporated by reference herein.

BACKGROUND

Technical Field

The present disclosure relates to an input/output circuit to which an external voltage that is higher than a power supply voltage of the input/output circuit section may be applied, that may pulled up or pulled down to the external voltage, and that has a tolerant function used in signal interface section of a semiconductor integrated circuit.

Related Art

In signal interfaces used between semiconductor integrated circuits, there are cases in which a signal interface between semiconductor integrated circuits having different power supply voltages (namely, different signal levels (for example, 3V and 5V)) may be required. In such cases, it is typical to use, as the signal interface of the semiconductor integrated circuit at the low voltage side, an input/output circuit that have a tolerant function that can receive an external voltage that is higher than the power supply voltage, or that can pull up or pull down the signal.

Conventionally, as an input/output circuit having a tolerant function, for example, Japanese Patent Application Laid-Open (JP-A) No. 2005-260587 discloses an input/output circuit of a semiconductor integrated circuit device. In JP-A No. 2005-260587 a bi-directional or output tri-state buffer circuit 1, which is the input/output circuit of the semiconductor integrated circuit device, includes a Pch main Tr (PMOS transistor) 2, Nch main Tr (NMOS transistors) 3 and 4, an output PAD 5, a floating well charging circuit 7, a PchTr (PMOS transistor) 9 having a floating well, a transistor gate 10 configured by a PchTr and an NchTr having floating wells, an EB-PAD potential determination section 21, a bias voltage generating section 22, a power supply potential/bias voltage switching circuit 23, a NAND gate 41, a NOR gate 42, and an inverter IV 43. The bi-directional or output tri-state buffer circuit 1 receives inputs of an input signal IN and an enable signal EB.

The EB-PAD potential determination section 21 of the bi-directional or output tri-state buffer circuit 1 is connected to the enable signal EB and the output PAD 5, and determines the state of the circuit based on the signal level of the enable EB signal and on the PAD potential from the output PAD 5. The EB-PAD potential determination section 21 then outputs a switching signal in accordance with the result of this determination to the bias voltage generating section 22 and the power supply potential/bias voltage switching circuit 23. On the other hand, the bias voltage generating section 22 is connected to an output power supply voltage VDDIO, and outputs a generated output potential Vbias to the power supply potential/bias voltage switching circuit 23. Furthermore, the power supply potential/bias voltage switching circuit 23 is connected to the output power supply voltage VDDIO and the bias voltage generating section 22, and outputs either the VDDIO voltage or the bias voltage Vbias to a gate of the PchTr9, based on the switching signal from the EB-PAD potential determination section 21. As a result, in the output tri-state buffer circuit 1, in a disenable state, the PAD potential is pulled up to an external potential VTT from an L potential or from an H level.

In addition, JP-A No. 2006-157081 discloses an input/output circuit having a tolerant function. In JP-A No. 2006-157081, tri-state output circuit 1 that serves as the input/output circuit includes a one-shot pulse generator circuit 10, an OE/PAD potential determination circuit 20, a bias circuit 30, a floating well charging circuit 40, a transfer gate 50, a 2-input NAND circuit 61, an inverter 62, a 2-input NOR circuit 63, P-MOS transistors 64 and 65, N-MOS transistors 66 and 67, and a resistor 68. The tri-state output circuit 1 outputs an input signal from an output pad PADo which is input from the input terminal A.

In this tri-state output circuit 1, the P-MOS transistor 65 drives the output pad PADo based on a predetermined signal, the P-MOS transistor 64 controls the potential of a node connected to a gate of the P-MOS transistor 65, and the one-shot pulse generator circuit 10 outputs pulses having a predetermined time width in a case in which a transition in the signal level of a predetermined signal has occurred. Moreover, the bias circuit 30 generates a bias voltage used to control the P-MOS transistor 64 during the period in which the pulses are being output, and applies this bias voltage to a gate of the P-MOS transistor 64. As a result, pull-up is performed swiftly in the tri-state output circuit 1, and any increase in current consumption is suppressed.

In conjunction with recent increases in the scale of integration and diversification of function and the like, suppressing current consumption in a semiconductor integrated circuit has become an urgent issue. Input/output circuits between semiconductor integrated circuits are no exception to this, and suppressing current consumption or suppressing the scale of the circuitry continues are required. Although an object of the bi-directional or output tri-state buffer circuit 1 disclosed in JP-A No. 2005-260587 is to suppress current consumption, it is still necessary to use circuits such as the EB-PAD potential determination section 21, the bias voltage generating section 22, and the power supply voltage/bias voltage switching circuit 23 and the like. Accordingly, there is considerable room for improvement from the standpoint of suppressing current consumption and suppressing increases in the scale of the circuitry. In addition, although an object of the tri-state output circuit 1 disclosed in JP-A No. 2006-157081 to reduce current consumption, it is still necessary to use the one-shot pulse generator circuit 10, the OE/PAD potential determination circuit 20, the bias circuit 30, and the floating well charging circuit 40 and the like. Accordingly, there is considerable room for improvement from the standpoint of suppressing current consumption and suppressing increases in the scale of the circuitry.

SUMMARY

The present disclosure provides an input/output circuit that may reduce current consumption by simple circuit structure.

A first aspect of the present disclosure is an input/output circuit including: a first transistor that, based on an input signal input into an input terminal and an enable signal input to an enable terminal that switches a validity and invalidity of an output, drives a load connected between an output terminal and an external power supply; a first switch provided between the input terminal and a control terminal of the first transistor, the first switch including a first switching terminal that switches between connecting or blocking the input signal; and a switch control section configured to control the first switching terminal based on the enable signal, wherein, in a case in which a logic of the enable signal has transitioned, the switch control section controls the first switching terminal to cause the first switch to be in a connecting state for a predetermined period, to input the input signal to the control terminal of the first transistor, and to suppress a current flowing to the load from the first transistor.

According to the above aspect, an input/output circuit of the present disclosure may reduce current consumption by simple circuit structure.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments for implementing the present disclosure will be described in detail with reference to the drawings. In the following exemplary embodiment, an input/output circuit that pulls down an output in accordance with an input signal is described as an example.

[First Exemplary Embodiment]

Figure 1:
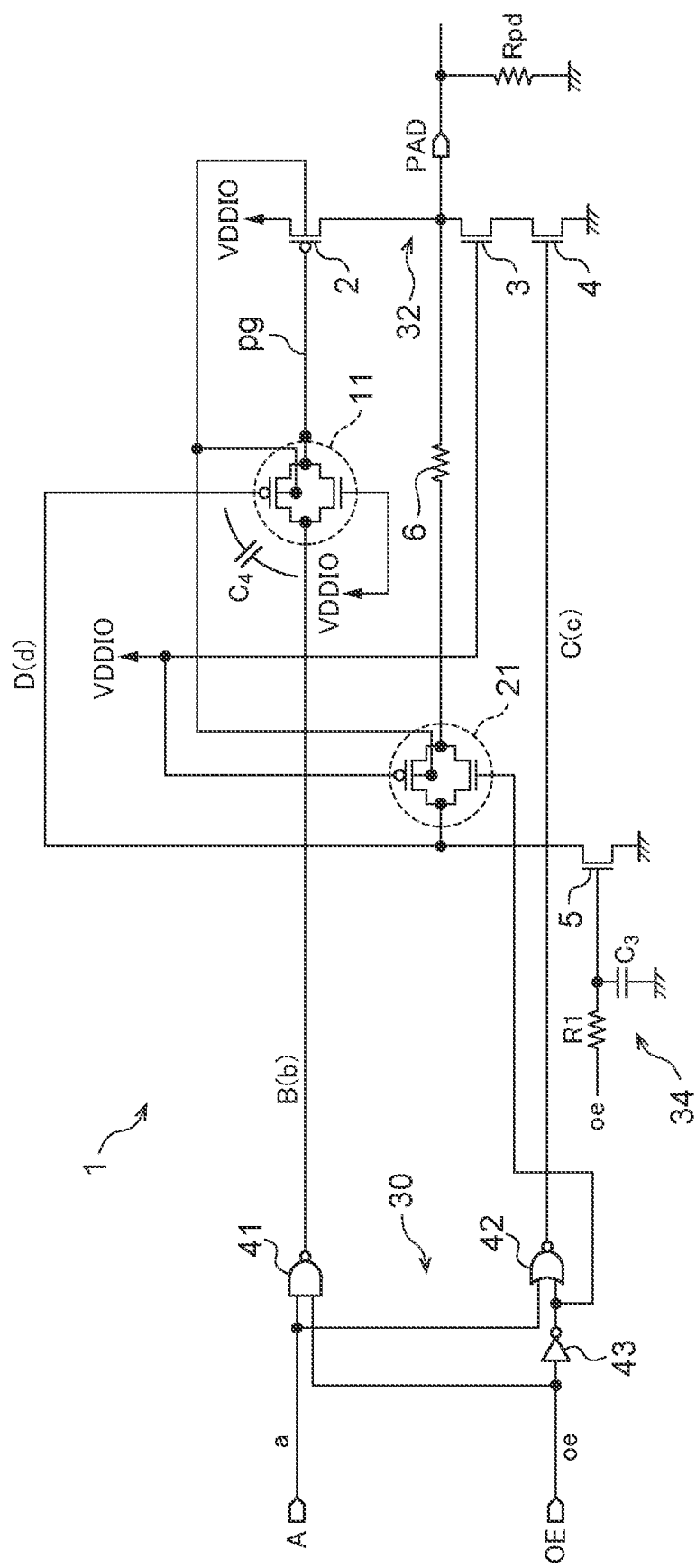
FIG. 1 is a circuit diagram showing a structure of an input/output circuit according to a first exemplary embodiment.

An input/output circuit according to the present exemplary embodiment will now be described with reference to FIG. 1. As is shown in FIG. 1, an input/output circuit 1 according to the present exemplary embodiment includes a P-type MOS (Metal Oxide Semiconductor) transistor (hereinafter, referred to as a PMOS transistor) 2, N-type MOS transistors (hereinafter, referred to as NMOS transistors) 3, 4, and 5, analog switches 11 and 21, a negative AND circuit (hereinafter, referred to as a NAND circuit) 41, a negative OR circuit (hereinafter, referred to as a NOR circuit) 42, an inverter 43, a resistor R1, a capacitance C3, and a resistor 6. In FIG. 1, VDDIO shows a power supply on a high potential side of the input/output circuit 1. In the input/output circuit 1 according to the present exemplary embodiment, a ground is used as the low potential side. However, the present disclosure is not limited thereto, and a negative potential power supply may be used. In the input/output circuit 1, in order to rapidly transmit the level of the VDDIO to a gate of the output PMOS transistor 2, the timing at which the NMOS transistor 5 is switched to an OFF state is controlled. The NMOS transistor 5 controls the gate potential of the PMOS transistor of the analog switch 11. Note that the PMOS transistor 2 corresponds to a "first transistor" according to the present disclosure, while the NMOS transistor 5 corresponds to a "second transistor", and a gate of a MOS transistor corresponds to a "control terminal" according to the present disclosure.

The input/output circuit 1 is provided with an input pad A, an output enable pad OE, and an output pad PAD. An output signal that corresponds to an input signal which is input into the input pad A is output from the output pad PAD. A pull-down resistor Rpd that pulls down an output signal is connected to the output pad PAD. The output enable pad OE is a pad that receives an input of an output enable signal oe, which is a signal that switches an output between valid and invalid. In the present exemplary embodiment, an output is enabled (i.e., is valid) in a case in which the output enable signal oe is at a high level (hereinafter, referred to as "H"), and an output is disenabled (i.e., is invalid) in a case in which the output enable signal oe is at a low level (hereinafter, referred to as "L"). In a case in which the output enable signal oe is H (hereinafter, this may be denoted as "oe=H"), an output signal corresponding to the logic of the input signal a that is input to the input pad A is output from the output pad PAD. In contrast, in a case in which oe=L, the output signal is in an indeterminate state, namely, is in a high impedance state (hereinafter, referred to as an "HZ state"), and output from the output pad PAD is blocked. Note that, in the present exemplary embodiment, as an example, H is the potential of the power supply VDDIO and L is the ground. Note that the pull-down resistor Rpd corresponds to a "load" of the present disclosure.

The NAND circuit 41 is a 2-input NAND circuit, and the input pad A is connected to one input thereof, while the output enable pad OE is connected to another input thereof. The NOR circuit 42 is a 2-input NOR circuit, and the output enable pad PAD is connected via the inverter 43 to one input thereof, and the input pad A is connected to another input thereof. In addition, a circuit state determination section 30 is configured by the NAND circuit 41, the NOR circuit 42, and the inverter 43. If an input signal into the input pad A is expressed as "a", an OE input signal into the output enable pad is expressed as "oe", a signal of a node B which is an output of the NAND circuit 41 is expressed as "b", and a signal of a node C which is an output of the NOR circuit 42 is expressed as "c", then combinations (b, c) of logical values of the signals b and c relative to combinations (a, oe) of logical values of the input signal a and the output enable signal oe becomes as shown below.

(a, oe)=(H, H)→(b, c)=(L, L)
(a, oe)=(L, H)→(b, c)=(H, H)
(a, oe)=(H, L)→(b, c)=(H, L)
(a, oe)=(L, L)→(b, c)=(H, L)

In other words, the NAND circuit 41 only outputs L in a case in which both the input signal a and the output enable signal oe are H. An output of the NAND circuit 41 is connected via an analog switch 11 (described below) to the gate of the PMOS transistor 2 provided at an output stage of the input/output circuit 1. Additionally, the NOR circuit 42 only outputs an H level, in a case in which the input signal a is L and the output enable signal oe is H (i.e., an output from the inverter 43 is L). An output of the NOR circuit 42 is connected to a gate of the NMOS transistor 4 provided at the output stage of the input/output circuit 1.

Both the analog switch 11 and the analog switch 21 are what is known as a transfer gate, in which the respective sources and drains of a PMOS transistor and an NMOS transistor are connected and combined. A gate of the NMOS transistor of the analog switch 11 and a gate of the PMOS transistor of the analog switch 21 are connected to the power supply VDDIO. In a case in which the PMOS transistor and the NMOS transistor are ON, a transfer gate passes signals in both directions, and in a case in which the PMOS transistor and the NMOS transistor are OFF, the transfer gate is placed in an HZ state. Note that the gate of the PMOS transistor of the analog switch 11 corresponds to a "first switching terminal" according to the present disclosure, and a connecting section between the source and the drain of the analog switch 11 corresponds to an "input/output section" according to the present disclosure.

As is shown in FIG. 1, the output section 32 of the input/output circuit 1 includes the PMOS transistor 2 and the NMOS transistors 3 and 4. The gate of the PMOS transistor 2 is connected via the analog switch 11 to the output of the NAND circuit 41. The gate of the NMOS transistor 4 is connected to the output of the NOR circuit 42. This PMOS transistor 2 and NMOS transistor 4 are transistors that are used to drive the output pad PAD.

In contrast, the internal power supply voltage VDDIO is constantly applied to the gate of the NMOS transistor 3 provided between the NMOS transistor 4 and the PMOS transistor 2. In other words, the NMOS transistor 3 is constantly in ON state. This NMOS transistor 3 is a protective element provided to prevent any damage at the NMOS transistor 4. In other words, among the tolerant functions of the input/output circuit 1 according to the present exemplary embodiment, the NMOS transistor 3 is a circuit element that is provided to enable an external power supply voltage to be applied thereto.

The resistor R1 and the capacitance C3 shown in FIG. 1 form a delay section 34. The delay section 34 according to the present exemplary embodiment is an integration circuit, and has a function of delaying the output enable signal oe (i.e., of dampening the waveform thereof). Operations of the delay section 34 are described in detail below. Note that the resistor 6 is an input protection resistor.

Next, operations of the PMOS transistor 2 and the NMOS transistor 4 will be described more specifically. In a case in which both the output enable signal oe and the input signal a are H, L which has been output from the NAND circuit 41 is applied via the analog switch 11 to the gate of the PMOS transistor 2. As a result, since the PMOS transistor 2 is ON, and the output pad PAD and the power supply VDDIO are mutually short-circuited, the potential of the output pad PAD changes to H. At this time, since L is being output from the NOR circuit 42, the NMOS transistor 4 is OFF.

Moreover, in a case in which the output enable signal oe is H and the input signal a is L, H which is output from the NOR circuit 42 is applied to the gate of the NMOS transistor 4. As a result, since the NMOS transistor 4 is ON, and the output pad PAD is grounded via the NMOS transistors 3 and 4, the potential of the output pad PAD changes to L. At this time, since H is being output from the NAND circuit 41, the PMOS transistor 2 is OFF.

Furthermore, in a case in which the output enable signal oe is L, the NAND circuit 41 outputs H, and the NOR circuit 42 outputs L. Due thereto, the PMOS transistor 2 and the NMOS transistor 4 are OFF, and the output pad PAD changes to an HZ state.

Next, an operation of the delay section 34 will be described. Here, an operation performed in a case in which the output pad PAD, which is in an H state, is pulled down to the ground by the pull-down resistor Rpd that is connected to the output pad PAD, will be described. At this time, the input signal a is H, and the output enable signal oe is H.

Here, by changing the output enable signal oe to L, the output pad PAD changes to an HZ state, and is pulled down to the ground by the pull-down resistor Rpd that is connected to the outside, due to the operation described below. In other words, since the output pad PAD changes to H, and the output enable signal oe changes to L, the signal b of the node B input into the analog switch 11 transitions from L to H. The signal d of the node D at this time is L. Consequently, due to a parasitic capacitance C4 between the wiring of the node D that is connected to the gate of the PMOS transistor of the analog switch 11 and the wiring of the node B, the signal d (d=L) of the node D is pulled to the signal b of the node B (namely, to the potential of the power supply VDDIO which is H). In a case in which the level of the signal d of the node D changes to H, the analog switch 11 is blocked.

In contrast, since of the above-described operation, although the output enable signal oe transitions from H to L, the output enable signal oe that is input into a gate of the NMOS transistor 5 by an operation of the delay section 34 is held at H for the length of a time constant of the delay section 34. In other words, the ON state of the NMOS transistor 5 continues for the period of the time constant of the delay section 34, and the signal d of the node D is held at L (i.e., at a ground level). As a consequence, since the PMOS transistor of the analog switch 11 is held in an ON state for the period of the delay time of the delay section 34, the analog switch 11 maintains a conductive state, and the node pg to which the gate of the PMOS transistor 2 is connected is rapidly charged to the same potential as that of the source of the PMOS transistor 2. Accordingly, since the PMOS transistor 2 changes to OFF, current flowing from the PMOS transistor 2 due to the pull-down of the output pad PAD is suppressed, and the output pad PAD is rapidly pulled down. As a result, the L of the output pad PAD is transmitted to the gate of the PMOS transistor of the analog switch 11 via the analog switch 21, so that the analog switch 11 changes to a conductive state, and the level H of the signal b of the node B is applied to the gate of the PMOS transistor 2 and the OFF state of the PMOS transistor 2 is confirmed.

As has been described above, in the input/output circuit 1 according to the present exemplary embodiment, during a pull-down, by controlling the ON state of the PMOS transistor of the analog switch 11, and by controlling the ON state of the NMOS transistor 5 using the time constant of the delay section 34 (i.e., the resistor R1 and the capacitance C3), the node pg to which the gate of the PMOS transistor 2 is connected is rapidly charged to the same potential as that of the source of the PMOS transistor 2. As a result, any current flowing from the PMOS transistor 2 due to the pull-down is suppressed, and the output pad PAD can be rapidly pulled down. In other words, the present exemplary embodiment may rapidly pull down the output pad PAD using a smaller circuit scale. Furthermore, in the related art, a circuit is required in order to charge a floating well. However, no such circuit is required in the present exemplary embodiment, so that the circuit scale may be reduced by a corresponding amount.

Here, in the present exemplary embodiment, a case in which a time constant provided by the resistor R1 and the capacitance C3 is used as the delay section 34 has been described. However, the present disclosure is not limited to this, and, for example, timing control may be performed using a multi-stage inverter.

[Second Exemplary Embodiment]

An input/output circuit 1A according to the present exemplary embodiment will now be described with reference to FIG. 2. The input/output circuit 1A according to the present exemplary embodiment controls the potential of the gate of the PMOS transistor of the analog switch 11 using charge distribution of the parasitic capacitance of the MOS transistor, such that H (i.e., the potential of the power supply VDDIO) is rapidly conveyed to the gate of the output PMOS transistor 2.

Figure 2:
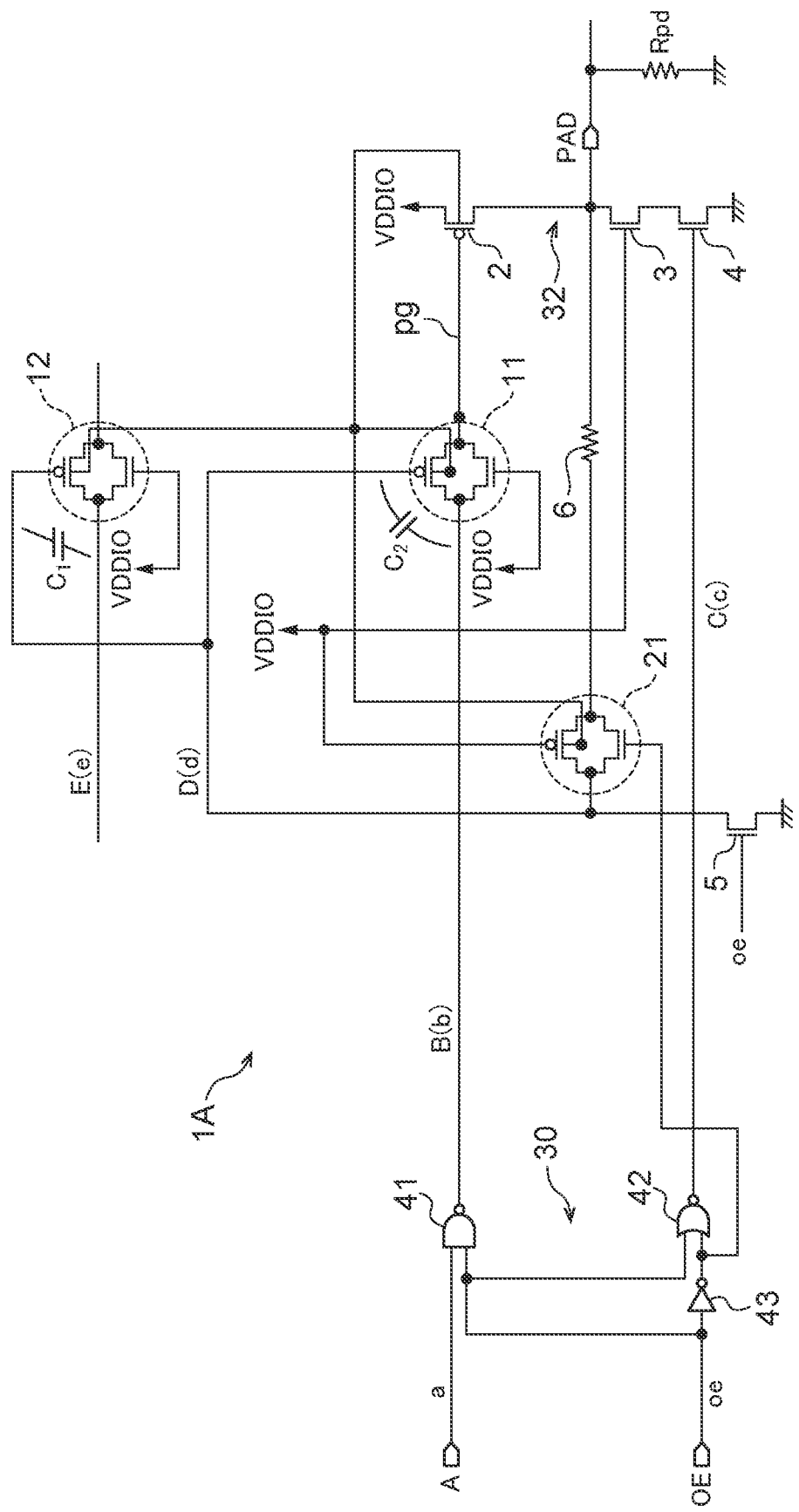
FIG. 2 is a circuit diagram showing a structure of an input/output circuit according to a second exemplary embodiment.

As is shown in FIG. 2, the input/output circuit 1A differs from the input/output circuit 1 shown in FIG. 1 in that, the delay section 34 of the input/output circuit 1 has been removed therefrom, and an analog switch 12 has been added thereto. Accordingly, the same symbols are used for the same structure as in the input/output circuit 1, and a detailed description thereof is omitted.

A gate of a PMOS transistor of the analog switch 12 is connected to the node D, while a gate of an NMOS transistor thereof is connected to the power supply VDDIO. One input/output section of the analog switch 12 is connected to a node E, while another input/output section is open. The analog switch 12 acts as a dummy analog switch in the charge distribution, in a case in which the potential of the gate of the PMOS transistor of the analog switch 11 is being controlled. Note that the analog switch 12 corresponds to a "second switch" according to the present disclosure, while the gate of the PMOS transistor of the analog switch 12 corresponds to a "second switching terminal", and the NMOS transistor 5 corresponds to a "third transistor" thereof.

Hereinafter, control of the analog switch 11 using the aforementioned charge distribution will be described. Here, an operation performed in a case in which the output pad PAD in an H state is pulled down to a ground using the pull-down resistor Rpd connected to the output pad PAD, is described. In the present exemplary embodiment, as an example, a level e of the node E that is input into the analog switch 12 is fixed at H. At this time, the input signal a is H, and the output enable signal oe is H.

Here, a capacitance (i.e., a parasitic capacitance of the PMOS transistor of the analog switch 12) between the node D that is connected to the gate of the PMOS transistor of the analog switch 12 and the node E that is connected to the input/output section of the analog switch 12 is denoted as C1. Further, a capacitance (i.e., a parasitic capacitance of the PMOS transistor of the analog switch 11) between the node D that is connected to the gate of the PMOS transistor of the analog switch 11 and the node B that is connected to the input/output section of the analog switch 11 is denoted as C2. In the present exemplary embodiment, the level of the gate of the analog switch 11 is controlled by redistributing the charge between the capacitance C1 and the capacitance C2. Firstly, in a state in which the input signal a is H, and the output enable circuit oe is H, as a result of the NMOS transistor 5 being turned ON, the level of the signal d of the node D changes to L. Since the level of the node E is H, charges are accumulated in the capacitance C1, however, since the level of the signal b of the node B is L, no charges re accumulated in the capacitance C2. Accordingly, the potential difference VD1 between the node D and the node E is an equivalent value to the potential Vddio of the power supply VDDIO as is shown in the following Formula (1).

$$Vd1 \approx Vddio \qquad (1)$$

Here, by changing the output enable signal oe to L, the output pad PAD changes to an HZ state, and is pulled down via the operation described below by the pull-down resistor Rpd that is connected to the outside. In other words, in a case in which the output pad PAD is in H state, then, by changing the output enable signal oe to L, the NMOS transistor 5 is changed to an OFF state, and the node D connected to the gate of the PMOS transistor of the analog switch 11 changes to an HZ state. In contrast, the signal of the node B that is input to the analog switch 11 changes from L to H. At this time, charge redistribution is performed between the capacitance C1 between the node D and the node E and the capacitance C2 between the node D and the node B, and the potential Vd2 of the signal d of the node D changes to the level shown by the following Formula (2).

$$Vd2 = C2 \times Vddio \div (C1 + C2) \qquad (2)$$

In particular, in a case in which the capacitances C1 and C2 are equivalent, becomes Vd2=Vddio/2.

By controlling this Vd2 (<Vd1) such that the PMOS transistor of the analog switch 11 can be maintained in an ON state, a node pg to which the gate of the PMOS transistor 2 is connected is rapidly charged to the same potential as the source of the PMOS transistor 2. As a result, any current flowing from the PMOS transistor 2 due to the pull-down is suppressed, and the output pad PAD can be rapidly pulled down.

As is described above, the input/output circuit 1A of the present exemplary embodiment controls the level Vd2 that is determined by the charge redistribution due to the capacitance C1 between the node D and the node B and the capacitance C2 between the node D and the node E. Accordingly, the PMOS transistor of the analog switch 11 can be maintained in ON state, the level of the node pg to which the gate of the PMOS transistor 2 is connected can be rapidly charged to the same potential as the level of the source of the PMOS transistor 2. As a result, current flowing from the PMOS transistor 2 due to the pull-down is suppressed, and the output pad PAD can be rapidly pulled down. Namely, the present exemplary embodiment may rapidly pull down the output pad PAD using a smaller circuit scale. Furthermore, in the related art, a circuit is required in order to charge a floating well, however, no such circuit is required in the present exemplary embodiment, so that the circuit scale can be further reduced by a corresponding amount.

Here, in the present exemplary embodiment, a case in which the parasitic capacitance of transistors of the analog switches are used as the capacitances C1 and C2 has been described. However, the present disclosure is not limited to this, and, for example, the capacitance between capacitive elements or between wires may be used for the capacitances C1 and C2, or combinations of thereof may be used.

Note that, in the above-described exemplary embodiments, a case in which pull-down is performed using externally attached pull-down resistors has been described. However, the present disclosure is not limited to this, and, for example, a pull-down resistor may be incorporated into each input/output circuit. Additionally, in the above-described exemplary embodiment, a case in which the present disclosure is applied to a pull-down resistor has been described. However, the present disclosure is not limited to this, and may also be applied to a pull-up resistor.

What is claimed is:

1. An input/output circuit comprising:
    a first transistor that, based on an input signal input into an input terminal and an enable signal input to an enable terminal that switches a validity and invalidity of an output, drives a load;
    a first switch provided between the input terminal and a control terminal of the first transistor, the first switch including a first switching terminal that switches between connecting or blocking the input signal; and
    a switch control section configured to control the first switching terminal based on the enable signal,
    wherein, in a case in which a logic of the enable signal has transitioned, the switch control section controls the first switching terminal to cause the first switch to be in a connecting state for a predetermined period, to input the input signal to the control terminal of the first transistor, and to suppress a current flowing to the load from the first transistor,
    wherein the switch control section includes a second transistor connected to the first switching terminal, and a delay section having one end connected to a control terminal of the second transistor and another end connected to the enable terminal, and the predetermined period is determined by a delay time of the delay section.

2. The input/output circuit according to claim 1, wherein the first transistor is a P-type MOS transistor,
the second transistor is an N-type MOS transistor,
the first switch includes a P-type MOS transistor and an N-type MOS transistor whose drains and sources are connected, wherein a gate of the P-type MOS transistor of the first switch is the first switching terminal, and
a drain of the second transistor is connected to a gate of the P-type MOS transistor of the first switch.

3. An input/output circuit comprising:
a first transistor that, based on an input signal input into an input terminal and an enable signal input to an enable terminal that switches a validity and invalidity of an output, drives a load;
a first switch provided between the input terminal and a control terminal of the first transistor, the first switch including a first switching terminal that switches between connecting or blocking the input signal; and
a switch control section configured to control the first switching terminal based on the enable signal,
wherein, in a case in which a logic of the enable signal has transitioned, the switch control section controls the first switching terminal to cause the first switch to be in a connecting state for a predetermined period, to input the input signal to the control terminal of the first transistor, and to suppress a current flowing to the load from the first transistor, wherein
the switch control section includes a second switch including a second switching terminal that switches between connecting and blocking a predetermined signal,
the switch control section includes a second transistor connected to the first switching terminal and the second switching terminal via a connecting section, and
the predetermined period is determined by a transition of charges between a first capacitance, which is a capacitance between the connecting section and an input/output section of the second switch, and a second capacitance, which is a capacitance between the connecting section and an input/output section of the first switch.

4. The input/output circuit according to claim 3, wherein the first transistor is a P-type MOS transistor;
the second transistor is an N-type MOS transistor;
the first switch includes a P-type MOS transistor and an N-type MOS transistor whose drains and sources are connected, wherein a gate of the P-type MOS transistor of the first switch is the first switching terminal;
the second switch includes a P-type MOS transistor and an N-type MOS transistor whose drains and sources are connected, wherein a gate of the P-type MOS transistor of the second switch is the second switching terminal; and
a drain of the second transistor is connected to the gate of the P-type MOS transistor of the first switch, and to a gate of the P-type MOS transistor of the second switch.

5. The input/output circuit according to claim 1, further comprising an output terminal connected to the first transistor,
wherein, in a case in which the logic of the enable signal has transitioned, the output terminal is pulled down, or is pulled up to an external power supply.

6. The input/output circuit according to claim 1, further comprising an output terminal connected to the first transistor,
wherein the load is connected between the output terminal and an external power supply.

* * * * *